is

(12) United States Patent
Horsky et al.

(10) Patent No.: US 11,522,450 B2
(45) Date of Patent: Dec. 6, 2022

(54) METHODS AND SYSTEMS OF OPERATING DC TO DC POWER CONVERTERS

(71) Applicant: SEMICONDUCTOR COMPONENTS INDUSTRIES, LLC, Phoenix, AZ (US)

(72) Inventors: Pavel Horsky, Brno (CZ); Jan Plojhar, Mokra Horakov (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 559 days.

(21) Appl. No.: 16/454,870

(22) Filed: Jun. 27, 2019

(65) Prior Publication Data
US 2020/0313553 A1 Oct. 1, 2020

Related U.S. Application Data

(60) Provisional application No. 62/824,841, filed on Mar. 27, 2019.

(51) Int. Cl.
*H02M 3/158* (2006.01)
*H02M 3/157* (2006.01)
(Continued)

(52) U.S. Cl.
CPC ........... *H02M 3/158* (2013.01); *H02M 3/157* (2013.01); *H05B 45/37* (2020.01); *G11C 27/02* (2013.01)

(58) Field of Classification Search
CPC ............. H02M 1/0009; H02M 1/0016; H02M 1/0019; H02M 1/0025; H02M 1/0038;
(Continued)

(56) References Cited

U.S. PATENT DOCUMENTS 9,887,614 B1 * 2/2018 Horsky ................... H02M 1/44
2007/0103126 A1 5/2007 McDonald et al.
(Continued)

OTHER PUBLICATIONS

"Power Ballast and Dual LED Driver for Automotive Front Lighting 2nd Generation," OnSemiconductor Publication Order No. NCV78763/D, Feb. 2019, 51 pages, Copyright 2015 Semiconductor Components Industries, LLC.
(Continued)

*Primary Examiner* — Thienvu V Tran
*Assistant Examiner* — Carlos O Rivera-Perez
(74) *Attorney, Agent, or Firm* — Dickinson Wright PLLC; Mark E. Scott

(57) ABSTRACT

Operating DC to DC power converters. At least some of the example embodiments are methods including: driving current through an inductance in a first on cycle of the power converter; comparing, by a comparator, a signal indicative of current through the inductance coupled to a first input of the comparator to a threshold applied to a second input of the comparator, and asserting a comparator output responsive to the signal indicative of current meeting the threshold; sampling a differential voltage across the first and second inputs, the sampling responsive to assertion of a comparator output, and the differential voltage indicative of propagation delay through the comparator; and compensating the comparator in a second on cycle for the compensation delay based on the differential voltage, the second on cycle subsequent to the first on cycle.

20 Claims, 11 Drawing Sheets

(51) Int. Cl.
*H05B 45/37* (2020.01)
*G11C 27/02* (2006.01)

(58) Field of Classification Search
CPC .......... H02M 1/08; H02M 1/088; H02M 3/02; H02M 3/04; H02M 3/07; H02M 3/135; H02M 3/137; H02M 3/139; H02M 3/142; H02M 3/145; H02M 3/155; H02M 3/1552; H02M 3/1555; H02M 3/156; H02M 3/1563; H02M 3/1566; H02M 3/157; H02M 3/158; H02M 3/1582; H02M 3/1588; H05B 45/00; H05B 45/30; H05B 45/37; H05B 45/3725; H05B 45/375; H05B 45/38; H03F 3/45744; H03F 3/45748; H03F 3/45753; H03F 3/45757; H03F 3/45762; H03F 3/45766; H03F 3/45771; H03F 3/45775; H03F 3/45596; H03F 3/45892–45923; H03F 3/45968–45995; H03F 2200/375; H03F 2200/45038; H03F 2200/45041; H03F 2200/45042; H03F 2200/45044; H03F 2200/45152; G11C 27/00; G11C 27/02; G11C 27/024; G11C 27/026; G11C 27/028

USPC ........ 323/222–226, 266, 271–275, 277, 278, 323/280, 282–286, 351
See application file for complete search history.

(56) References Cited

U.S. PATENT DOCUMENTS

| | | | |
|---|---|---|---|
| 2009/0128109 A1* | 5/2009 | Brinkman | H02M 3/1588 323/282 |
| 2010/0091525 A1* | 4/2010 | Lalithambika | H03K 17/567 363/21.02 |
| 2012/0086515 A1 | 4/2012 | Yang et al. | |
| 2013/0009621 A1* | 1/2013 | Chen | G05F 1/561 323/282 |
| 2019/0128932 A1* | 5/2019 | Fernandez | H03F 1/30 |

OTHER PUBLICATIONS

"High Efficiency Buck Dual LED Driver with Integrated Current Sensing for Automotive Front Lighting," OnSemiconductor Publication Order No. NCV78723/D, Nov. 2015, 32 pages, Copyright 2015 Semiconductor Components Industries, LLC.

* cited by examiner

METHODS AND SYSTEMS OF OPERATING DC TO DC POWER CONVERTERS

CROSS-REFERENCE TO RELATED APPLICATIONS

This application claims the benefit of U.S. Provisional Patent Application No. 62/824,841, filed on Mar. 27, 2019, the entire contents of which is incorporated herein by reference.

BACKGROUND

Light-emitting diodes (LEDs) are increasing in popularity for lighting systems for a variety of reasons. The reasons for increased popularity may include greater light produced per unit of power supplied to the LED (compared, for example, to incandescent bulbs), and controllability of the LEDs. The popularity increase of LEDs is also true for the automotive industry.

BRIEF DESCRIPTION OF THE DRAWINGS

For a detailed description of example embodiments, reference will now be made to the accompanying drawings in which.

NOTATION AND NOMENCLATURE

Figure 1:
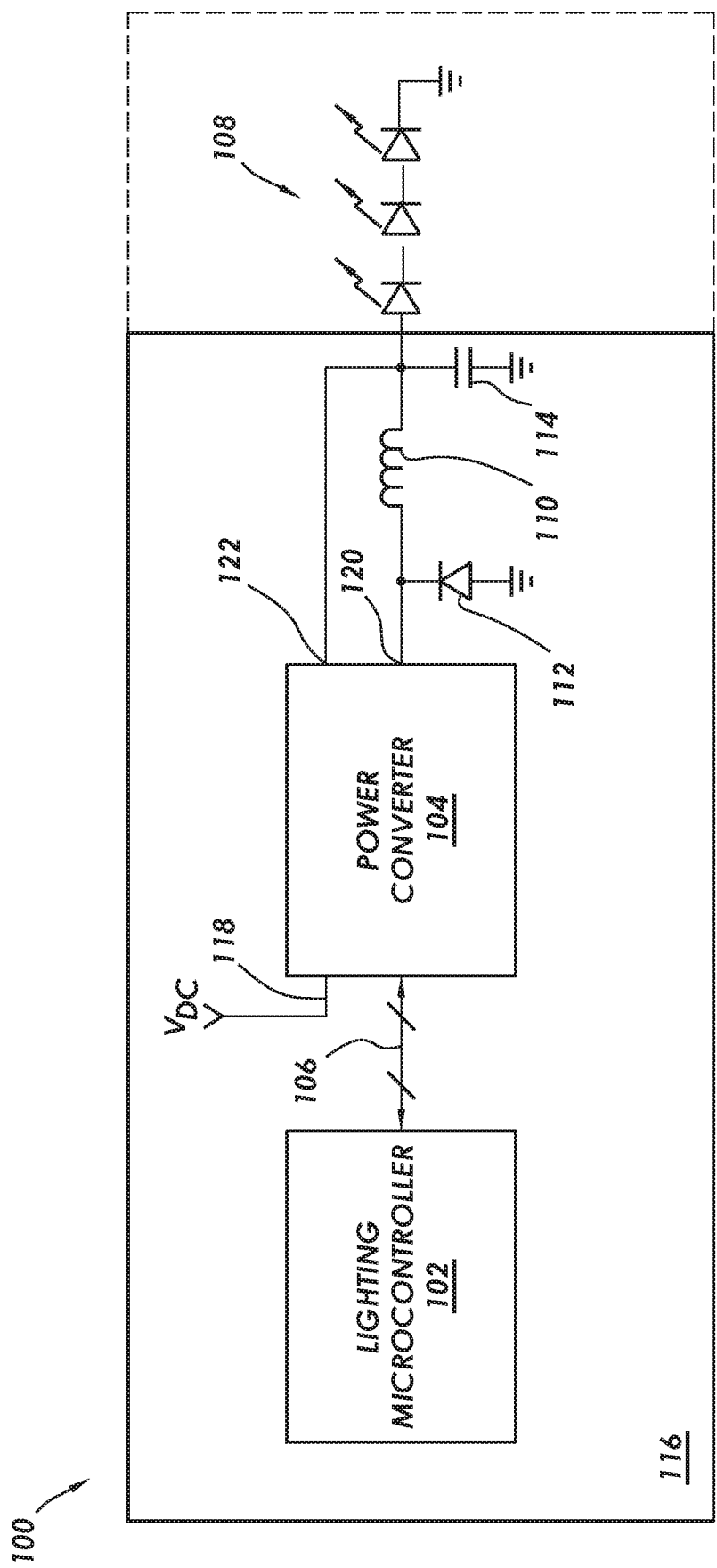
FIG. 1 shows a block diagram of a system for operating LEDs in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The terms "input" and "output" when used as nouns refer to connections (e.g., electrical, software), and shall not be read as verbs requiring action. For example, a timer circuit on a substrate may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Lead" when used as a noun refers to a connection (e.g., electrical, software), and shall not be read as a verb requiring action. For example, a switch may define a first lead and a second lead, along with a control input.

"Controller" shall mean individual circuit components on a substrate, an application specific integrated circuit (ASIC) constructed on a substrate, a microcontroller constructed on a substrate (with controlling software stored on or off the substrate), a field programmable gate array (FPGA), or combinations thereof configured to read signals and take control actions responsive to such signals.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various embodiments are directed to methods and systems of operating direct current (DC) to DC power converters. More particularly, example embodiments are directed to systems where turning off a main transistor, thereby controlling on or charge cycle of an inductor, is triggered by a comparator. The example systems are directed to compensating the comparator for signal propagation delay through the comparator and/or DC offset of the comparator that may cause the main transistor to turn off sooner or later than expected. More particularly still, example embodiments are directed to sampling a differential voltage across inputs of the comparator at a point in time when the comparator output is asserted (e.g., during an on cycle of main transistor, or at the end of the on cycle), and then compensating the comparator in a subsequent on cycle based on the differential voltage sampled. The various embodiments were developed in the context of a DC to DC converters driving light emitting diode (LED) circuits, and the description is based on the developmental context. However, the developmental context shall not be read as a limitation as to the applicability of the various compensation systems and methods. The specification first turns to a high level description of an example system.

FIG. 1 shows a block diagram of an example system for operating light emitting diodes (LEDs) in accordance with at least some embodiments. In particular, FIG. 1 shows an example system 100, which could be a lighting system for an automobile, or a lighting system for a home, to name a few. The example system 100 comprises a lighting microcontroller 102. The lighting microcontroller 102 may communicate with other devices and implement an overall lighting control strategy for many LEDs within a system (e.g., automobile, home). The example lighting microcontroller 102 communicatively couples to a power converter 104 by way of a communication channel 106. The communication channel 106 may take many forms. In some cases the communication channel may be a plurality of conductors upon which analog and/or Boolean signals may be exchanged between the lighting microcontroller 102 and the power converter 104. In other cases, the communication channel may be a parallel or serial communication bus. In one specific embodiment, the communication channel 106 is a serial peripheral interface (SPI) bus, but other bus systems and protocols may be used (e.g., I$^2$C bus, Universal Serial Bus (USB)).

The power converter 104 in the example system is a driver circuit designed and constructed to convert power at one DC voltage to another DC voltage. In the example system, the power converter 104 converts power from voltage source $V_{DC}$ to a lower voltage (based on additional circuits discussed below), and thus may be referred to as a buck-type DC to DC power converter. The functionality of the power converter 104 is implemented by various circuits (discussed more below) constructed on one or more semiconductors substrates. The semiconductor substrate(s) may be packaged in any suitable form, such as a 16 pin dual in-line package (DIP). Other packaging configurations may also be used.

In the system shown, the example load is a set of LEDs 108, and the power converter 104 couples to the LEDs 108 by way of an inductor 110. However, the power converter 104 couples to a load of any suitable type, such as an electromagnet, solenoid, voice coil, or DC motor. It follows that for inductive loads the separate inductor 110 may be omitted. In the example system of FIG. 1, the power converter 104 couples to a first lead of the inductor 110, and the second lead of the inductor 110 couples to the LEDs 108 (illustratively shown as three LEDs coupled in series, but one or more LEDs in any electrical configuration may be used). Because the example system operates as a switching power converter, during some portions of the operation of the power converter 104 (e.g., an on cycle), the power converter provides or drives current to the inductor 110, storing energy in the field around the inductor 110. During other portions of the operation the power converter 104 provides no electrical current to the inductor 110 (e.g., an off cycle), and during off cycles current continues to flow through the inductor 110 as the field around the inductor is discharging or collapsing. During periods of time when the inductor 110 is discharging, the freewheeling diode 112, coupled between the first lead of the inductor and ground or common, provides the conduction path for the inductor 110 current. In other cases, a synchronous rectifier (e.g., operationally controlled field-effect transistor (FET)) may be used in place of the freewheeling diode 112. The circuit components may also include smoothing capacitor 114 to smooth the output voltage provided to the LEDs 108.

The example system 100 may be implemented with the various components in separate physical locations. For example, in automotive systems the lighting microcontroller 102 may reside within the cab of the automobile, while the power converter 104 may reside in the engine compartment, and the LEDs 108 disposed as headlights or fog lights for the automobile. In other cases, the example system 100 may be coupled in whole or part on an underlying printed circuit board (PCB). As shown in FIG. 1, the lighting microcontroller 102, the power converter 104, and the various circuit components (e.g., freewheeling diode 112, inductor 110, and smoothing capacitor 114) may reside on a single PCB 116, with the LEDs 108 disposed elsewhere. Alternatively, the LEDs 108 may also be disposed on the PCB 116 (as shown by the dashed extension of the PCB 116 of FIG. 1).

The power converter 104 thus has a $V_{DC}$ input 118 coupled to the voltage source $V_{DC}$ (e.g., 12 Volts from an automobile battery). The power converter 104 also defines a switch node 120 electrically between the freewheeling diode 112 and inductor 110. The power converter 104 may optionally include a voltage sense input 122 coupled to the second lead of the inductor (i.e., coupled to sense voltage provided to the LEDs 108).

Figure 2:
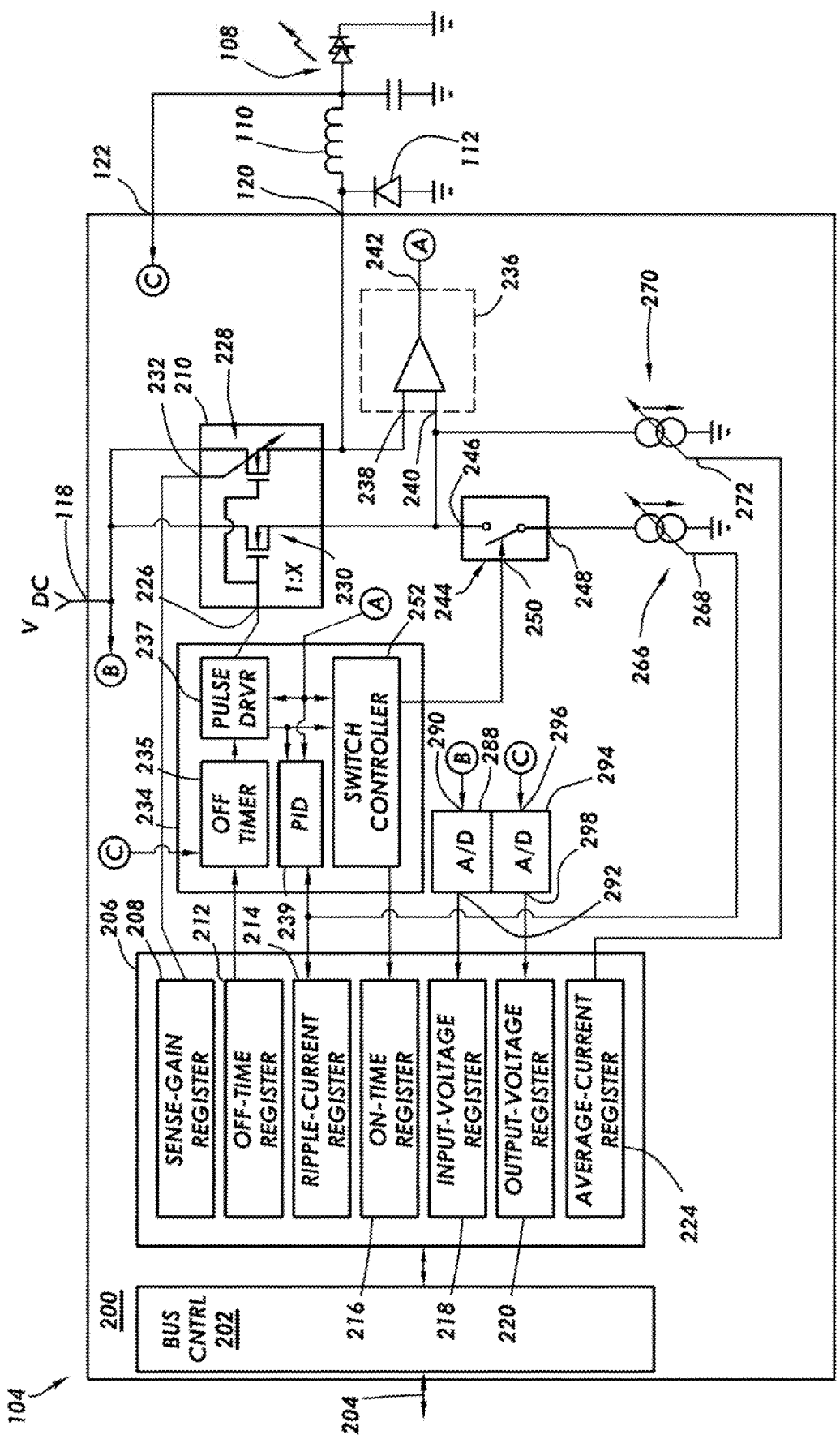
FIG. 2 shows an electrical block diagram of a power converter in accordance with at least some embodiments.

FIG. 2 shows an electrical block diagram of a power converter 104 in accordance with at least some embodiments. In particular, FIG. 2 shows the power converter 104 comprises a semiconductor substrate 200, upon which the various circuits and controllers for the power converter 104 are constructed. While only one semiconductor substrate 200 is shown in FIG. 2, the various circuits may be implemented on two or more semiconductor substrates co-packed into a single packaged semiconductor device. The example system comprises a bus controller 202 that defines a bus interface 204 over which the bus controller 202 is configured to communicate other devices, such as the lighting microcontroller 102 (FIG. 1). The example system further comprises a plurality of a registers 206 accessible by the bus controller 202. That is, the bus controller 202, and thus the lighting microcontroller 102, may read and/or write the plurality of registers 206.

For the example system of FIG. 2, seven registers are implemented in the plurality of registers. One example register is a sense-gain register 208. In example systems the power switch 210 implements a sensing or reference transistor (discussed more below) whose $R_{on}$ resistance is a known quantity higher than the main transistor (also discussed more below) and used such that a reference current through the reference transistor may create a voltage substantially the same as the main transistor. The sense-gain register 208 may hold a value indicative of the relationship or ratio of current of the reference transistor relative to the main transistor. The registers may further comprise an off-time register 212 accessible by the bus controller 202. The off-time register 212 is configured to hold a value indicative of off time of the pulse signal applied to the power switch 210. A ripple-current register 214 may be implemented and accessible by the bus controller 202. The ripple-current register 214 is configured to hold a value indicative of ripple current, which may be initially written by the lighting microcontroller 102 (FIG. 1) by way of the bus interface 204; however, the value indicative of ripple current in the ripple-current register 214 becomes a control variable of a control loop for the power converter 104. An on-time register 216 may be implemented and is accessible by the bus controller 202. The on-time register 216 is configured to hold a value indicative of on time of the pulse signal applied to the power switch 210 on the most recent on or asserted cycle of the pulse signal applied to the power switch 210. An input-voltage register 218 may be implemented and accessible by the bus controller 202. The input-voltage register 218 is configured to hold a value indicative of input voltage $V_{DC}$ supplied to the power converter 104. An output-voltage register 220 may be implemented and accessible by the bus controller 202. The output-voltage register 220 is configured to hold a value indicative output voltage of the power converter 104. And finally, an average-current register 224 may be implemented and accessible by the bus controller 202. The average-current register 224 is configured to hold a value indicative of average current provided by the power converter 104 to the LEDs 108. In example systems, the value indicative of average current is the set point of the control loop for the power converter 104.

The power converter 104 comprises the power switch 210. The power switch 210 defines a gate input 226. In particular, the power switch 210 comprises a main transistor 228 having its drain coupled to the $V_{DC}$ by way of the $V_{DC}$ input 118, and having its source coupled to the LEDs 108 by way of the switch node 120 and inductor 110. The power switch 210 further comprises a reference transistor 230 likewise having its drain coupled to $V_{DC}$. In example systems, when the gate input 226 is asserted, both the main transistor 228 and the reference transistor 230 enable current flow from drain to source. In other systems, the reference transistor 230 may be permanently conductive. Load current is drawn through the main transistor 228 and creates voltage proportional to the load current. A known reference current is drawn through the reference transistor 230 (with X times bigger Ron than the main transistor) that creates a reference voltage. The comparator compares these two voltages. The comparator toggles when the voltages are equal, which means the load current is X times the reference current. This information is then used to control the PWM activity. In some systems, the ratio of current flow as between the main transistor 228 and the reference transistor 230 may be settable or adjustable, and in such systems the ratio of the current (1:X) is controlled by the value written to the sense-gain register 208, with the sense-gain register 208 coupled to a control input 232 of the power switch 210.

Still referring to FIG. 2, the example power converter 104 further comprises a regulating controller 234. The regulating controller 234 produces control signals used within the power converter 104, and in some cases the regulating controller 234 implements the control loop (e.g., a proportional-integral-differential (PID) controller 239) to control average current produced by the power converter. Thus, the regulating controller 234 is coupled to the gate input 226 of the power switch 210. The regulating controller 234 is configured to receive from the lighting microcontroller 102 (FIG. 1) an indication of off time. In the example system, the indication of off time is received from the off-time register 212 which is coupled to the regulating controller 234. The regulating controller 234 is configured to generate a pulse signal on the gate input 226 of the power switch 210, with de-asserted time of the pulse signal based on the indication of off time, and with asserted time of the pulse signal based on the value indicative of average current held in the average-current register 224 and the most recent value indicative of ripple current held in the ripple-current register 214. As shown in FIG. 2, the average-current register 224 is not directly coupled to the regulating controller 234. The control relationship between the value indicative of off time, the value indicative of average current, and the pulse signal is discussed in greater detail below after introduction of other power converter 104 circuit components.

The example power converter 104 further comprises a comparator system 236 that has a first input 238, a second input 240, and a comparator output 242. The first input 238 is coupled to the source of the main transistor 228, and the second input 240 is coupled to the source of the reference transistor 230. The comparator output 242 is coupled to the regulating controller 234. The example system further comprises a current switch 244 having a control input 250, a first switch lead 246, and a second switch lead 248. The first switch lead 246 is coupled to the source of the reference transistor 230 (and the second input 240). The control input 250 of the current switch 244 is coupled to the regulating controller 234, and in particular a switch controller 252 within the regulating controller 234.

The example system further comprises a current source 266 coupled to the second switch lead 248 of the current switch 244. The current source 266 has a control input 268 that sets the controlled current flow through the current source 266. In the example system of FIG. 2, the control input 268 is coupled to the value indicative of ripple current held in the ripple-current register 214. The system further comprises a second current source 270 coupled to the second comparator input 240. The current source 270 has a control input 272 that sets the controlled current flow through the current source 270. In the example system of FIG. 2 the control input 272 is coupled to the value indicative of average current held in the average-current register 224.

Still referring to FIG. 2, the example power converter 104 also comprises an analog-to-digital (A/D) converter 288 having an analog input 290 and a digital output 292. The analog input 290 is coupled to the $V_{DC}$ (as shown by bubble "B"). The digital output 292 is coupled to the input-voltage register 218. The A/D converter 288 thus continually updates the input-voltage register 218 with the input voltage provided to the power converter 104. The example power converter 104 also comprises A/D converter 294 having an analog input 296 and a digital output 298. The analog input 296 is coupled to the output voltage of the converter, and more particularly the node between the inductor 110 and the LEDs 108 (as shown by bubble "C"). The digital output 298 is coupled to the output-voltage register 220. The A/D converter 294 thus continually updates the output-voltage register 220 with the output voltage provided by the power converter 104.

The example power converter 104 is operated as an average current controller. The specification describes setup and operation as an average current controller to inform an understanding of the operation of the comparator system 236. In particular, initially the lighting microcontroller 102 (FIG. 1) provides certain information to the plurality of registers 206 used by the system. For example, the lighting microcontroller 102 may write into the sense-gain register 208 a value indicative of the ratio of the currents of the main transistor 228 and reference transistor 230 such that the power switch 210 implements the desired ratio. Next, for a particular system setup (e.g., inductance of the inductor and expected output voltage), the off time of the pulse signal provided to the power switch 210 is constant, and thus the lighting microcontroller 102 may write into the off-time register 212 a value indicative of off time. The value indicative of off time is coupled to an off timer 235 that provides a timer signal to the pulse driver 237. In some embodiments the off time generated by the off timer 235 can be inversely proportional to $V_{LED}$ (e.g., voltage on output of the converter, marked as "C") in order to keep the ripple constant when output voltage changes. In operation the pulse driver 237 drives the pulse signal to the gate input 226, and the de-asserted time of the pulse signal is constant and set by the off timer 235 (and thus the value indicative of off time in the off-time register 212). The lighting microcontroller 102 may further write an initial value into the ripple-current register 214. As noted above, however, the value held in the ripple-current register 214 is the control variable within a control loop controlling average current, and thus the value within the ripple-current register 214 varies during operation. In one example system, once the power converter 104 is operational the PID controller 239 (illustratively shown within the regulating controller 234) updates the value in the ripple-current register 214 at the end of each on cycle as part of the closed-loop control of average current.

The lighting microcontroller 102 may further write into the average-current register 224 a value indicative of average current, which is effectively the set point for the control implemented by the power converter 104. Thus, as expressly shown in FIG. 2, the current source 266 thus produces a current related to the ripple current, and current source 270 thus produces a current related to average current, and these two current sources play a role in setting the on time of the pulse signal provided to the gate input 226 of the power switch 210 (by operation of the comparator system 236, and discussed more below).

Figure 3:
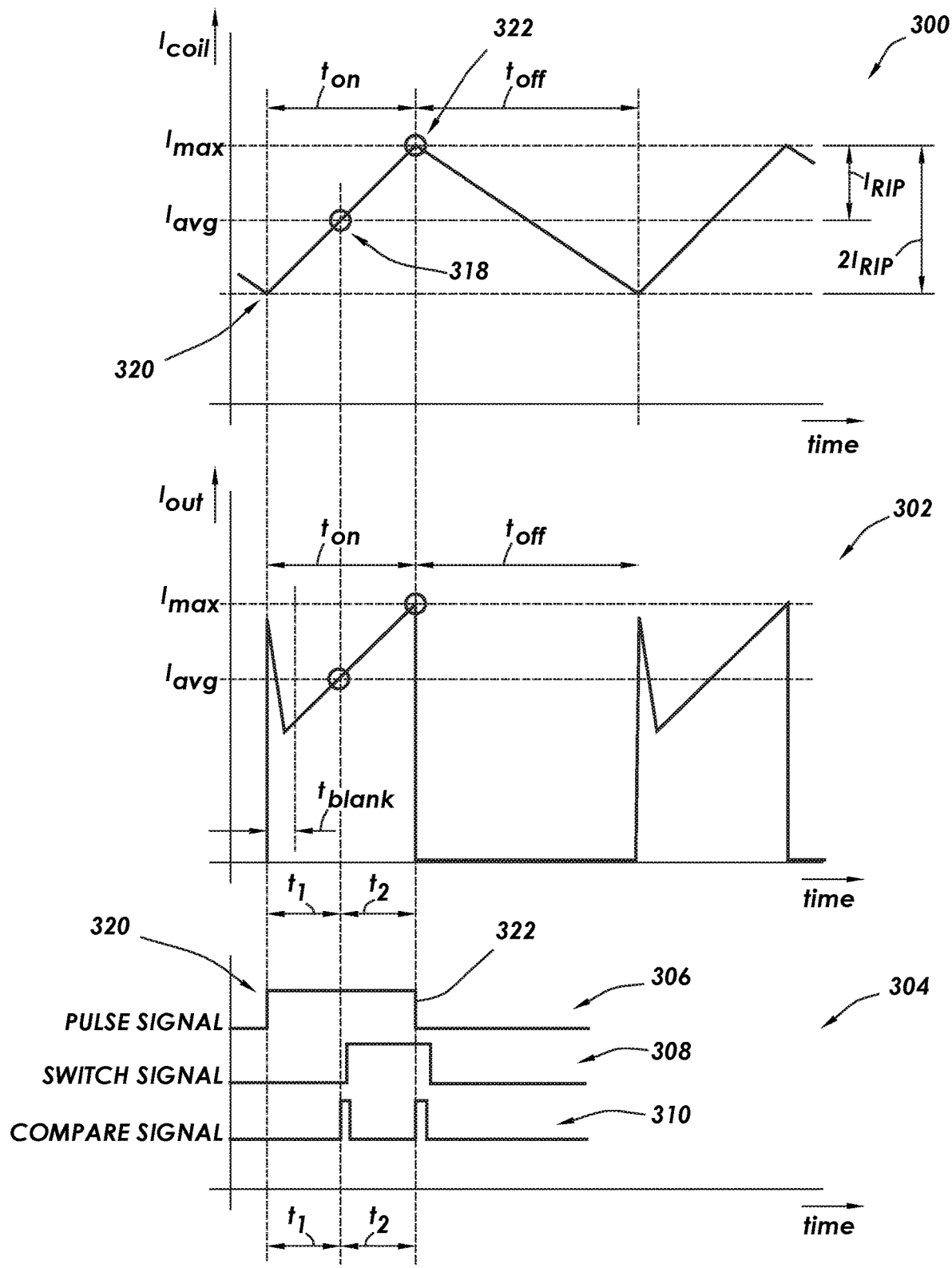
FIG. 3 shows a timing diagram in accordance with at least some embodiments.

FIG. 3 shows a timing diagram in accordance with at least some embodiments. In particular, plot 300 shows the inductor current as a function of time, and in particular through about 1.5 switching periods. It is noted that inductor current is not actually measured in the example power converter 104, but the plot is provided for purposes of explanation. Plot 302 shows current through the main transistor 228 as a function of time. Plot 304 shows a plurality of example Boolean signals within the system, and in particular shows the pulse signal 306 provided to the gate input 226 of the power switch 210, the switch signal 308 provided to the control input 250 of the current switch 244, and a compare signal 310 created by the comparator system 236.

Referring simultaneously to FIGS. 2 and 3 (and specifically plots 300 and 304), at the expiration of off timer 235 (time 320) the pulse signal 306 is asserted by the pulse driver 237. The power switch 210 is thus activated, and the current through inductor begins to rise as shown in plot 300. After a finite amount of time referred to as $t_{ON}$, the current through the inductor reaches a peak value referred to in plot 300 as $I_{MAX}$. When the inductor current reaches $I_{MAX}$ at time 322, the pulse signal 306 is de-asserted (i.e., the power switch 210 becomes non-conductive), and the off timer 235 is triggered forcing the next fixed off time, referred to as $t_{OFF}$ in FIG. 3. For a constant input voltage and constant output voltage, when providing a steady-state current to the load, the on time $t_{ON}$ and off time $t_{OFF}$ should be constant. However, varying physical conditions (e.g., exterior temperature, temperature of the LEDs 108, number of LEDs 108 in operation, input voltage) may cause a change in operation of the power converter 104 in order to hold the set point average current. For example, ambient temperature swings may change the effective inductance of the inductor 110. Ambient temperature swings may change the impedance of the wiring to the LEDs. Input voltage may vary. In order to provide the set point average current, the power converter controls the $t_{ON}$ time by adjusting the $I_{MAX}$ level.

The on time $t_{ON}$ can be conceptually divided into a first period t1 and a second period t2 as shown in FIG. 3. The first period t1 begins when the pulse signal 306 is asserted and the power switch 210 becomes conductive, and the first period ends when the current through the inductor meets a mid-point current 318. The second period t2 begins when the current through the inductor meets the mid-point current 318 and ends when the current reaches peak current $I_{MAX}$ at time 322. When time length of the first period t1 matches the time length of the second period t2, it works out mathematically that the midpoint current 318 is the average current $I_{AVG}$ provided to the LEDs 108. The power converter 104 thus monitors the length of the first period t1 and length of the second period t2, and regulates the system to have t1 match t2 in steady-state operation.

As mentioned above, in the example system ripple current is the controlled variable modulated to control a set point average current. The relationship between ripple current, the $I_{AVG}$ current, and the $I_{MAX}$ current is shown in plot 300. In particular, in steady-state operation the peak-to-peak current value is twice the ripple current (i.e., $2*I_{RIP}$) as illustrated. It follows that the relationship between ripple current and $I_{MAX}$ is that the $I_{MAX}$ is $I_{AVG}$ plus $I_{RIP}$. Conceptually then, during transient cycles when t1 does not equal t2 in an on cycle $t_{ON}$, the system 100 adjusts the value indicative of ripple current in the ripple-current register 214 in an attempt to force t1 to equal t2 in the next on cycle. For example, if t1 is greater than t2 in a first on cycle of the pulse signal, the value indicative of ripple current is increased (i.e., $I_{MAX}$ is increased) in an attempt to lengthen t2 in the next on cycle of the pulse signal. Oppositely, if t1 is less than t2 in a first cycle of the pulse signal, the value indicative of ripple current is decreased (i.e., $I_{MAX}$ is decreased) in an attempt to shorten t2 in the next on cycle.

Before turning to the example implementation of measuring t1 and t2 by the power converter 104, attention turns briefly to plot 302. Again, plot 302 shows current through the main transistor 228. When the pulse signal 306 is asserted, both the reference transistor 230 and the main transistor 228 become conductive. Because of parasitic capacitances within the system 100, initially there may be a high inrush current through the main transistor 228 that in some cases may exceed even the expected average current $I_{AVG}$ or even $I_{MAX}$. The inrush current is not truly indicative of inductor current (as shown by plot 300), and thus in order to avoid false indications by the comparator system 236, the example system implements a blanking time $t_{BLANK}$.

In accordance with example embodiments, the on time $t_{ON}$ is measured by the power converter by a combination of the comparator system 236, the current switch 244, and the current sources 266 and 270. In particular, during period t1, the current switch 244 is off or non-conductive. Thus, of the two current sources 266 and 270, only the second current source 270 is coupled to the second input 240, and as shown in FIG. 2 the current source 270 drives a current proportional to the value indicative of average current held in the average-current register 224 (i.e., the set point average current). Comparator system 236 thus compares the voltage on the source of the main transistor 228 (which voltage is proportional to current through the main transistor 228) to a voltage on the source of the reference transistor 230 (the voltage fixed by current source 270). When the voltages cross (indicating $I_{AVG}$ has been met), the comparator system 236 asserts comparator output 242 as shown by compare signal 310. Once the compare signal 310 is asserted, the regulating controller 234 asserts the control input 250 of the current switch 244, thus closing or making conductive the current switch 244.

Making the current switch 244 conductive switches the first current source 266 into the circuit coupled to the second input 240. The compare signal 310 on the comparator output 242 is thus de-asserted again, and the comparator system 236 continues to compare the voltage on the source of the main transistor 228 to a voltage on the source of the reference transistor 230 (the voltage fixed by current sources 266 and 270). When the voltages cross (indicating $I_{MAX}$ has been met), the comparator system 236 again asserts comparator output 242 as shown by compare signal 310. The second assertion of the compare signal 310 signals the end of the on cycle $t_{ON}$ and the beginning of the off cycle $t_{OFF}$. For purposes of control, however, the time t1 is measured by the regulating controller 234 as the time between assertion of the pulse signal 306 (or, equivalently, expiration of the off timer) and the first assertion of the compare signal 310. The time t2 is measured by the time between the first and second assertions of the compare signal 310.

In some example systems, the PID controller 239 receives indications of the time periods t1 and t2 and makes adjustments to the value indicative of the ripple current in the ripple-current register 214 as needed to balance t1 and t2 and thus provide the set point average current. In other cases, however, devices external to the power converter 104, such as the lighting microcontroller 102, may read various values from the plurality of registers 206 and implement the control loop aspects. For example, the lighting microcontroller 102 may: write a value indicative of average current to the power converter; write a value indicative of ripple current to the power converter; and recursively read a values indicative of t1 and t2 (in registers for t1 and t2 not specifically shown). More particularly, in one example system where the control loop resides external to the power converter 104, the switch controller 252 may write a value indicative of t1 and a value indicative of t2 to one or more registers. The lighting microcontroller 102 may thus read the values indicative of t1 and t2 from the on-time register 216 across the bus interface 204, and then write an updated value indicative of ripple current to the ripple-current register 214 to control the $I_{MAX}$ current in the next switching cycle. In another embodiment where the control loop resides external to the power converter 104, the switch controller 252 may write a status indicative of t1 and t2 comparison into the on-time register 216 (e.g., one bit value additional to the on time measured).

Referring again to FIG. 2. The comparator system 236 thus plays a central role in operation of the power converter 104. Any shortcomings in operation of the comparator system 236 may manifest themselves in the overall power converter 104 providing more or less than the set point average current to the LEDs 108. The example embodiments of this application are directed to improving performance of the comparator system 236. More particularly still, example embodiments are directed to compensating the functionality of the comparator system 236 for propagation delays through a comparator within the comparator system 236 and/or compensating the functionality of the comparator system 236 for DC offset of a comparator within the comparator system 236.

In particular and as discussed above, in operation the comparator system 236 asserts its comparator output 242 when the voltage on the first input 238 falls through the voltage on the second input 240. In fact, the assertion takes place twice in each on cycle $t_{on}$, for example, once when the voltage is indicative of passing the $I_{AVG}$ midpoint current 318 (FIG. 3), and a second time when the voltage is indicative of passing the $I_{MAX}$ current. In the ideal case, the voltages as between the first and second inputs 238 and 240 are identical when the comparator output 242 is asserted. However, the inventors of this specification have found that, because of propagation delay through a comparator of the comparator system 236, and DC offset within the comparator system 236, the actual voltage on the first input 238 will be different than the voltage on the second input 240 based on how quickly the current through the main transistor 228 is rising, delay through the comparator of the comparator system 236, and/or the DC offset of the comparator of the comparator system 236. It follows that the actual average current may be higher or lower than the set point average current desired.

Figure 4:
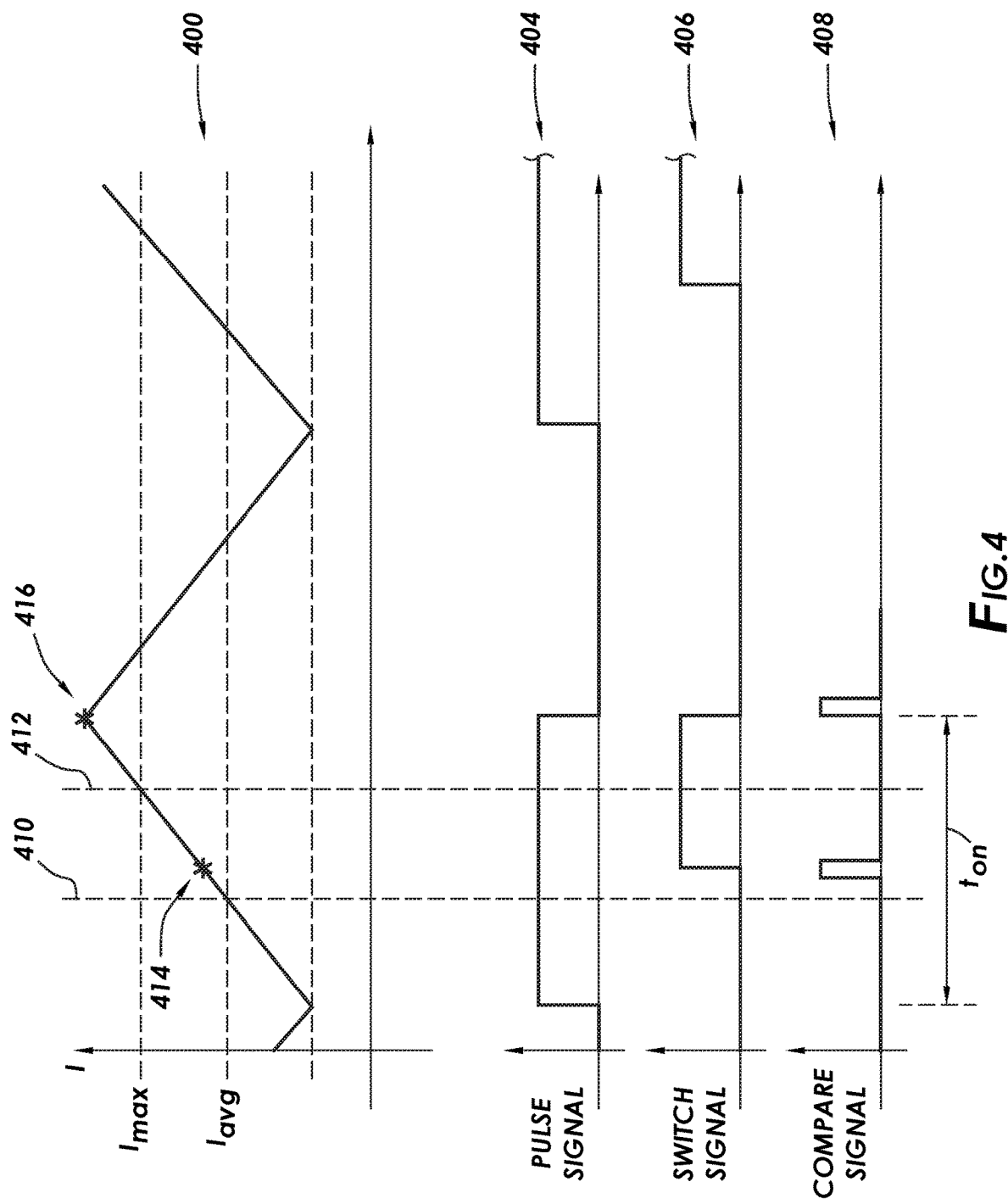
FIG. 4 shows a timing diagram in accordance with at least some embodiments.

FIG. 4 shows a timing diagram in accordance with at least some embodiments, and in order to show an example issue surrounding propagation delay through the comparator system 236. In particular, plot 400 shows the inductor current as a function of time, and in particular through about 1.5 switching periods. Again, in example embodiments the inductor current is not actually measured by the power converter 104, but the plot is provided for purposes of explanation. Plot 404 shows the pulse signal 306 provided to the gate input 226 of the power switch 210, plot 406 shows the switch signal 308 provided to the control input 250 of the current switch 244, and plot 408 shows the compare signal 310 created by the comparator system 236.

If there was no propagation delay through the comparator system 236, the compare signal 408 would initially go asserted at time 410, when the current through inductor matches the average current $I_{AVG}$. Similarly, if there was no propagation delay through the comparator system 236, the compare signal 408 would go asserted at time 412, when the current through inductor matches the peak current $I_{MAX}$. However, in each case the finite amount of time it takes a comparator to assert its comparator output when the inputs cross causes the assertions of the compare output to be delayed. In the case of the assertion associated with reaching $I_{AVG}$, the compare output 242 asserts later, as shown by star 414 and the delay exaggerated for clarity. In the case of the assertion associated with reaching $I_{MAX}$, the compare output 242 asserts later, as shown by star 416 and the delay exaggerated for clarity. The result of this example is that time length of the on cycle $t_{ON}$ is longer than desired, which means that the average current provided is greater than desired. A comparator having a non-zero DC offset can likewise affect when the regulating controller 234 views the comparator output 242 as transitioning from de-asserted to asserted.

Returning to FIG. 2. Various example embodiments reduce or eliminate the issues associated with propagation delay and/or DC offsets. In particular, during periods of time when the example power converter 104 is driving current through the inductor 110 in a first on cycle, a comparator within the comparator system 236 compares the signal indicative of current through the inductor (coupled to the first input 238) to a threshold applied to the second input 240 (by way of the current sources 266 and/or 270). The comparator asserts the comparator output 242 responsive to the signal indicative of current meeting the threshold. The comparator system 236 samples a differential voltage across the first and second inputs 238 and 240, the sampling responsive to assertion of the comparator output 242, and the differential voltage indicative of propagation delay through the comparator and/or DC offset of the comparator. The comparator system then compensates the comparator within the comparator system 236 in a second on cycle for the compensation delay based on the differential voltage such that the assertion of the comparator output 242 matches or more closes matches in time the point when signals on the first and second inputs 238 and 240 meet or match. In some example methods and systems, the sampling of the differential voltage is performed when the comparator output 242 is asserted associated with comparing the signal indicative of current through the inductor to the threshold being the peak current threshold $I_{MAX}$, triggering the end of the on cycle. In other cases, the example methods and systems sample when the comparator output 242 is asserted associated with comparing the signal indicative of current through the inductor to the threshold being the average current threshold $I_{AVG}$. In cases where the sampling takes place at the average current threshold, compensation takes place after the end of the on cycle (e.g., within the contiguous off cycle).

Figure 5:
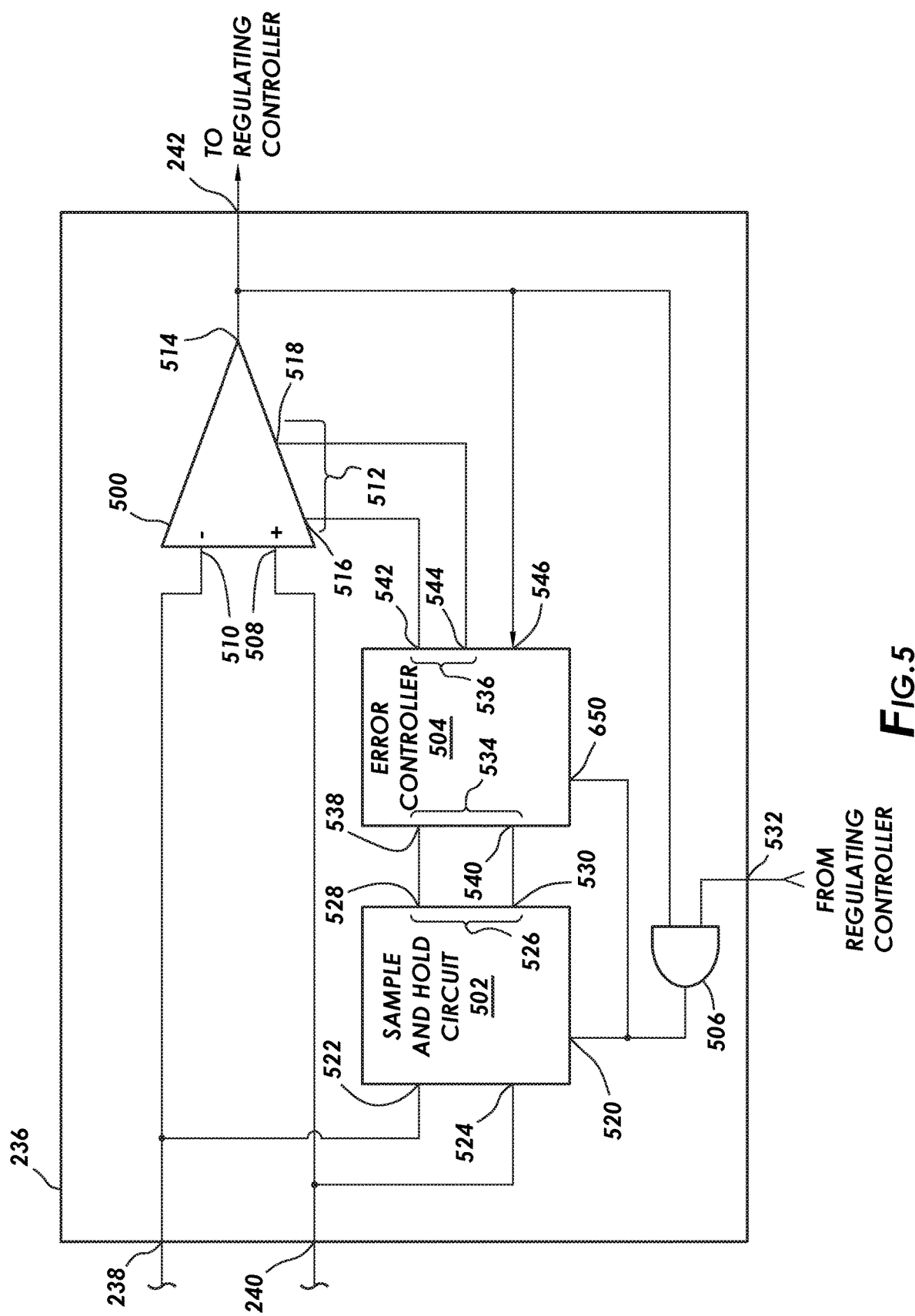
FIG. 5 shows, in partial block diagram and partial schematic form, a comparator system in accordance with at least some embodiments.

FIG. 5 shows, in partial block diagram and partial schematic form, a comparator system 236 in accordance with at least some embodiments. In particular, the example comparator system 236 comprises a comparator 500, a sample and hold circuit 502, an error controller 504, and a logical AND gate 506. Each will be addressed in turn.

The comparator 500 defines a non-inverting input 508, an inverting input 510, a compensation input 512, and an output 514. In the example system, the inverting input 510 is coupled directly to the first input 238, the non-inverting input 508 is coupled directly to the second input 240, and the output 514 is coupled directly to comparator output 242. The compensation input 512 in the example system is a differential input defining a first connection 516 and a second connection 518. In other cases, a single input for the compensation input 512 may be used (e.g., a single input referenced to a reference voltage, such as ground). The compensation implemented by the comparator 500 based on the signals provided to the compensation input 512 may take many forms. For example, the compensation input 512 may be an input used to null the output 514 of the comparator, but may also be used to address the propagation delay as discussed above (e.g., providing a non-zero DC offset to implement some or all the propagation delay compensation). In other cases, the signal applied to the compensation input 512 may be used to bias the inverting input 510, the non-inverting input 508, or both. For example, the compensation signal may be used to provide a positive bias to the signal indicative of current through the inductor such that the signal crosses the threshold earlier and the compare output 242 is asserted earlier, thus compensating for delay through the comparator 500.

The example comparator system 236 further comprises the sample and hold circuit 502. The sample and hold circuit defines a trigger input 520, a first sample input 522, a second sample input 524, and a sample output 526. In example systems, the sample output 526 is a differential output comprising a first connection 528 and a second connection 530. In other cases, a single output from the sample and hold circuit 502 may be used (e.g., a single output referenced to a reference voltage, such as ground). The sample and hold circuit 502 in example systems is configured to sample a differential voltage across the first and second sample inputs 522 and 524 (corresponding to the differential voltage across the first input 238 and second input 240), the sampling responsive to assertion of the trigger input 520. The sample and hold circuit 502 is further configured to apply the differential voltage to the sample output 526, in some cases responsive to de-assertion of the trigger input 520.

The sample and hold circuit 502 samples the differential voltage during an on cycle of the pulse signal applied to the power switch 210 (FIG. 2). More particularly, in some example systems the sample and hold circuit 502 samples the differential voltage when the comparator output 242 is asserted associated with the inductor current meeting the average current $I_{AVG}$. Thus, the trigger input 520 may be coupled to the comparator output 242. In other example systems, the sample and hold circuit 502 is configured to sample the differential voltage at termination of an on cycle (e.g., de-assertion of the pulse signal applied to the power switch 210). More particularly, the sample and hold circuit 502 may sample the differential voltage when the comparator output 242 is asserted associated with the inductor current meeting the peak current $I_{MAX}$. The regulating controller 234 (FIG. 2) may directly or indirectly determine when the sampling takes place by way of the sample control input 532 coupled to the logical AND gate 506 along with the comparator output 242. The regulating controller 234 may thus mask an assertion of the comparator output 242 to selectively control of assertion of the trigger input 520. In one example embodiment, the sample control input 532 is coupled to the control input 250 of the current switch 244 such that only the assertion of the comparator output 242 associated with the inductor current meeting the peak current $I_{MAX}$ is used to trigger the sample and hold circuit 502. In yet still other embodiments, the sample and hold circuit 502 samples the differential voltage at both the $I_{AVG}$ and $I_{MAX}$ crossings, and the signal provided on the sample output 526 being a combination (e.g., average) of the differential voltages of each sample. In other embodiments, the sample and hold circuit 502 samples the differential voltage at both the $I_{AVG}$ and $I_{MAX}$ crossings, and compensates based on each sample independently.

Still referring to FIG. 5, the comparator system 236 further includes the error controller 504. The example error controller 504 defines an error input 534, a control output 536, and in some cases a trigger input 650. In example systems, the error input 534 is a differential input comprising a first connection 538 and a second connection 540. In other cases, a single error input may be used (e.g., a single input referenced to a reference voltage, such as ground). Similarly, the control output 536 may be a differential output comprising a first connection 542 and a second connection 544. In other cases, a single control output may be used (e.g., a single output referenced to a reference voltage, such as ground). The error input 534 is coupled to the sample output 526 of the sample and hold circuit 502. The control output 536 is coupled to the compensation input 512 of the comparator 500. As will be discussed in greater detail below, in addition to compensating the comparator 500 for propagation delay issues, the comparator system 236 may also compensate the comparator 500 for DC offset, and to that end the error controller 504 also defines a sample input 546 coupled to the comparator 500. In some cases the sample input 546 may be coupled to the comparator output 242 as shown, but in other cases the sample input 546 may be coupled to any signal from which the DC offset can be determined, such as from an intermediate stage output of the comparator 500.

The error controller 504 is configured to supply a compensation signal on control output 536 based on the differential voltage over one or more cycles of the pulse signal applied to the power switch 210 (FIG. 2). The compensation signal compensates the comparator 500 for propagation delay through the comparator 500. More particularly, in some example systems the sample and hold circuit 502 samples the differential voltage during a first on cycle (e.g., at the $I_{AVG}$ point, at the $I_{MAX}$ point, or both), and passes a signal representative of the differential voltage to the error controller 504. The error controller 504, in turn, supplies the compensation signal during a second on cycle, subsequent to the first on cycle. In some cases, the subsequent on cycle is an immediately subsequent on cycle, but there may be one or more on cycles between when the differential voltage is measured and the resulting compensation signal being supplied to the comparator 500.

The error controller 504 can be conceptually considered to be a loop controller that makes periodic adjustments to the compensation signal applied to the compensation output 536 based on the differential voltage (used as an error signal) with the goal of reducing the differential voltage or making the differential voltage zero at each sampling. Because the error signal in the form of the differential voltage is updated once each on cycle, the loop controller implemented by the error controller 504 is not necessarily continuous; rather, the updates to compensation signal may be determined once each period of the pulse signal applied to the power switch 210 (FIG. 2). Nevertheless, error controller 504 may implement one of several control methodologies, such as: Proportional Integral Differential (PID) control; Proportional Integral (PI) control; and/or integral-only control.

Figure 6:
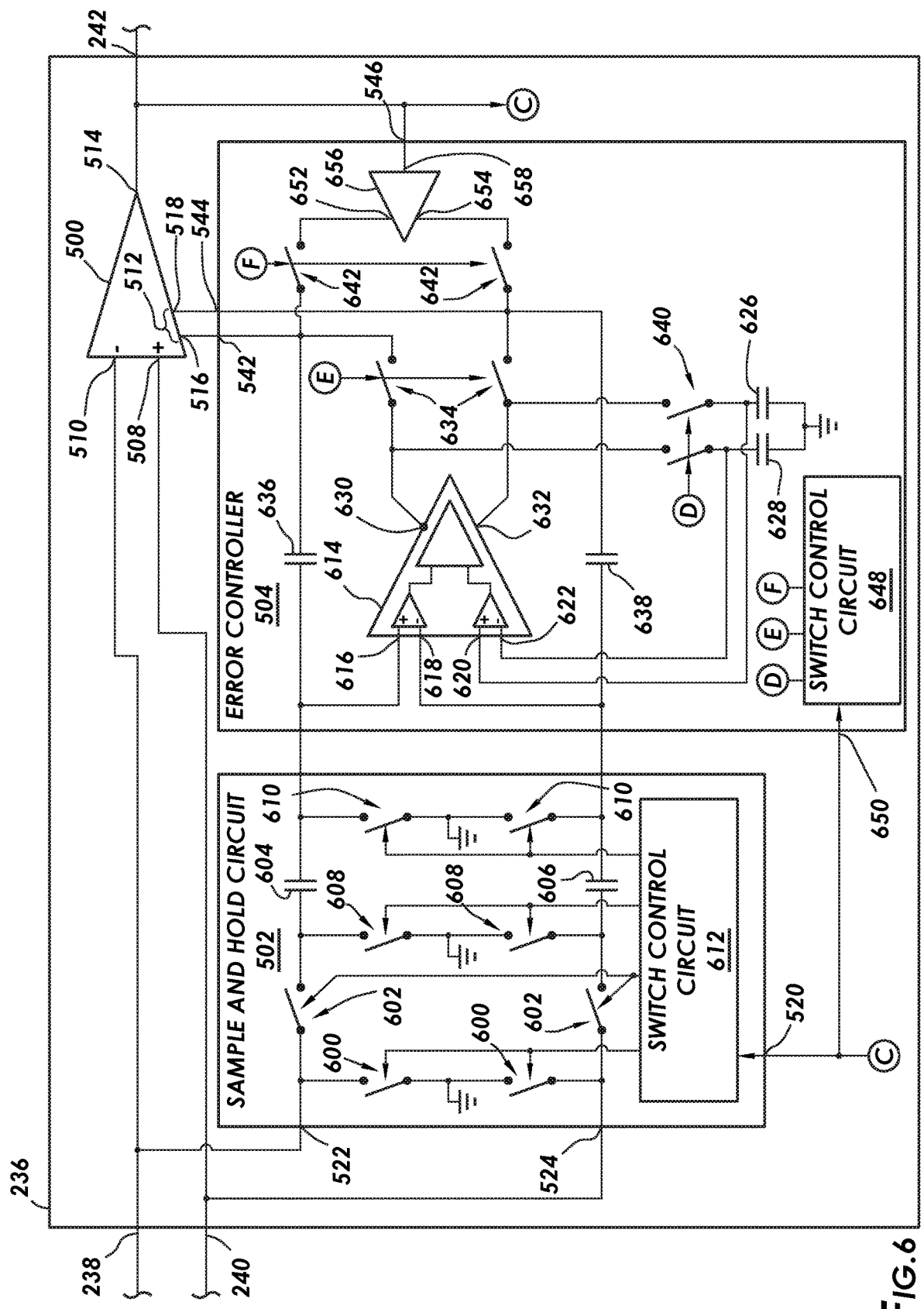
FIG. 6 shows a schematic diagram of a comparator system in accordance with at least some embodiments.

FIG. 6 shows a schematic diagram of a comparator system 236 in accordance with at least some embodiments. In particular, shown in FIG. 6 is the comparator 500, the sample and hold circuit 502, and the error controller 504. The example sample and hold circuit 502 comprises four sets of switches. While the switches are schematically shown as a physical switches, in practice the switches may be any electrically controlled switches (e.g., transistors, junction transistors, FETs, electrically controlled rectifiers). In particular, the example sample and hold circuit 502 comprises shorting switches 600. When conductive, the shorting switches 600 short and couple to ground the first and second sample inputs 522 and 524. Shorting the sample inputs 522 and 524 likewise shorts and couples to ground the first and second inputs 238 and 240, as well as shorts and couples to ground the inverting input 510 and non-inverting input 508 of the comparator 500. The example circuit further comprises sample switches 602. When conductive, the sample switches 602 couple the differential voltage across the first and second sample inputs 522 and 524 to the first leads of the capacitors 604 and 606. The example circuit further comprises shorting switches 608. When conductive, the shorting switches 608 short and couple to ground the first leads of the capacitors 604 and 606. The example circuit further comprises shorting switches 610. When conductive, the shorting switches 610 short and couple to ground the second leads of the capacitors 604 and 606. The example sample and hold circuit 502 further comprises a switch control circuit 612 which controls all the switches within the sample and hold circuit 502. For example, in the case of the various switches being electrically controlled switches in the form of FETs, the switch control circuit 612 may control assertion of the gates to ensure no cross-conduction occurs between sets of switches. The control implemented by the switch control circuit 612 may be based on the asserted and non-asserted state of the trigger input 520. Though states of the various switches at particular times will be discussed more below, at some point during each on cycle the sample and hold circuit 502 samples the differential voltage by coupling the first and second sample inputs 522 and 524 to the first leads of the capacitors 604 and 606, respectively. After the sampling (e.g., during the immediately subsequent off cycle), the voltages held by the capacitors 604 and 606 are applied to the error controller 504.

Still referring to FIG. 6, the example error controller 504 comprises an amplifier 614 in the example form of a transconductance amplifier (e.g., generating a current proportional to the voltages on the inputs). In particular, the amplifier 614 defines input 616 coupled to the second lead of the capacitor 604 of the sample and hold circuit 502. The amplifier 614 further defines input 618 coupled to the second lead of the capacitor 606 of the sample and hold circuit 502. The amplifier 614 further defines a compensation input in the form of first connection 620 and second connection 622.

The first connection 620 and second connection 622 are coupled to the first leads of compensation capacitors 626 and 628, respectively, and the second leads of the compensation capacitors 626 and 628 are connected to a reference voltage, such as ground. Given the transconductance nature of the amplifier 614, the output of the amplifier 614 in the example system is two connections 630 and 632 through which a current is driven proportional to the voltage across the input 616 and input 618.

The example error controller 504 comprises three sets of switches. While the switches are schematically shown as a physical switches, in practice the switches may be any electrically controlled switches (e.g., transistors, junction transistors, FETs, electrically controlled rectifiers). Switches 634 are coupled between the connections 630 and 632 and the second leads of capacitors 636 and 638, respectively. The second leads of the capacitors 636 and 638 also couple to the compensation input 512 of the comparator 500 (the compensation input 512 in the form of first and second connections 516 and 518). A first lead of capacitor 636 couples to the inverting input 616, and a first lead of capacitor 638 couples to the input 618.

The example error controller 504 further comprises switches 640 which selectively couple the connections 630 and 632 to the capacitors 628 and 626, respectively. The example error controller 504 further comprises switches 642 which selectively couple amplifier 656 to the second leads of capacitors 636 and 638. In example systems amplifier 656 implements a transconductance feature by way of outputs 652 and 654. That is, the amplifier 656 creates a current proportional to the voltage on the input 658 (coupled to and defining sample input 546). The error controller 504 further comprises a switch control circuit 648 which controls all the switches within the error controller 504. The control implemented by the switch control circuit 648 may be based on the asserted and non-asserted state of the trigger input 650, illustratively coupled to the comparator output 242.

The specification now turns to a description of operation of the example circuits of FIG. 6 by way of series of additional figures corresponding to various states in relation to the on cycle and off cycle of the power converter 104 (FIG. 1) within which the comparator system 236 is operated. In each of the following figures, switches that are conductive are shown as closed, and switches that are non-conductive are omitted.

Figure 7:
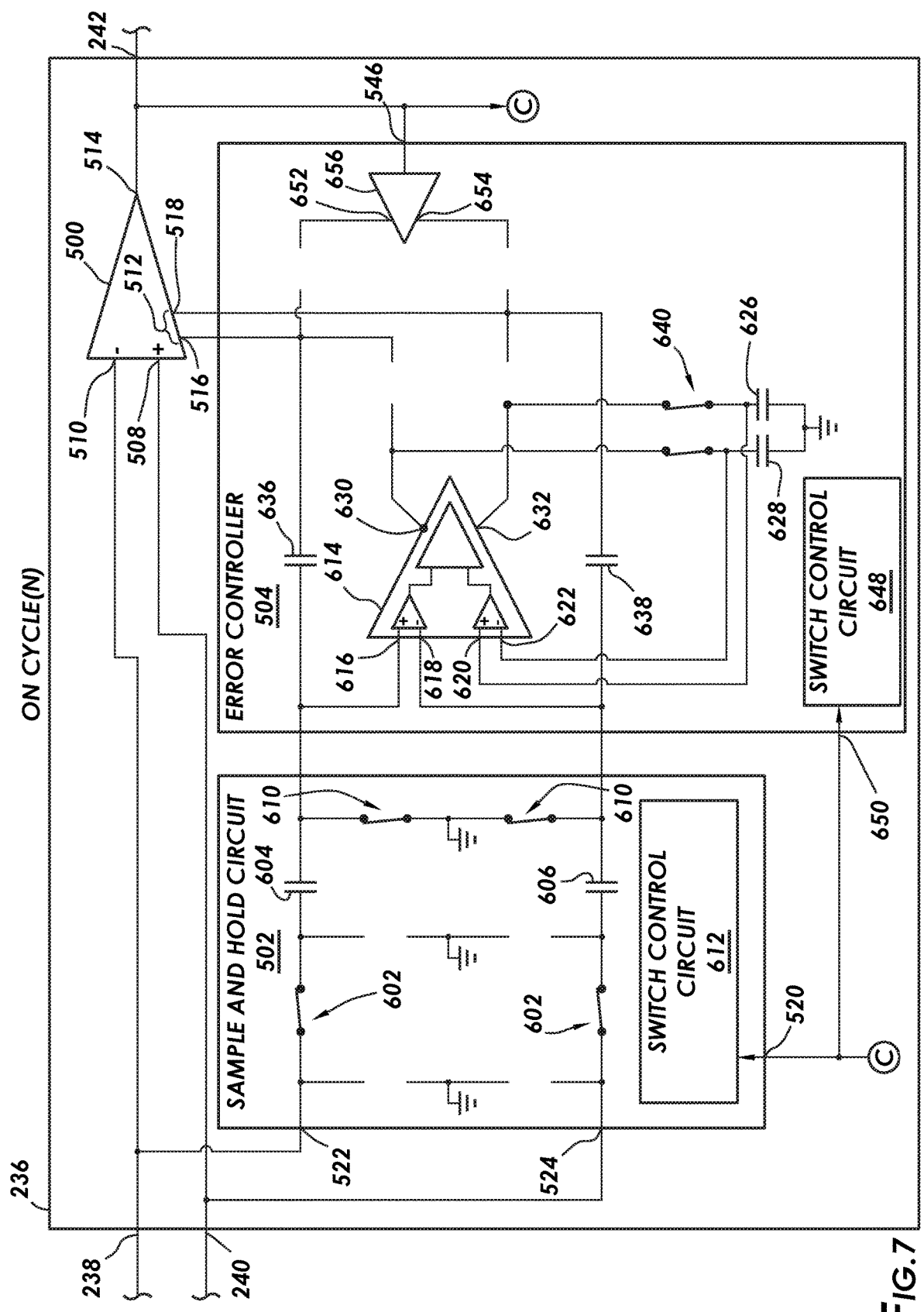
FIG. 7 shows the comparator system during an on cycle of the power converter, in accordance with at least some embodiments.

FIG. 7 shows the comparator system during an on cycle (referred to as on cycle (N)) of the power converter, in accordance with at least some embodiments. In particular, during the on cycle (N) the switches 602 and 610 in the sample and hold circuit 502 are conductive. Moreover, switches 640 in the error controller 504 are conductive. In the state shown in FIG. 7, the first lead of capacitor 604 is coupled to the first sample input 522 and the second lead of capacitor 604 is grounded. The first lead of capacitor 606 is coupled to the second sample input 524 and the second lead of capacitor 606 is grounded. It follows that the voltage across the first leads of the capacitors 604 and 606 is the differential voltage across the first sample input 522 and the second sample input 524. Switches 610 ground the second leads of capacitors 604 and 606, and also short and ground input 616 and input 618 of the amplifier 614 in the error controller 504. The example sample and hold circuit 502 stays in the condition shown in FIG. 7 during on cycle (N) until the trigger event occurs.

Still during on cycle (N), during periods of time when the capacitors 604 and 606 are coupled to the first sample input 522 and the second sample input 524 as shown, the error controller 504 is providing a compensation signal to the compensation input 512 of the comparator 500 (the compensation input in the example form of connections 516 and 518). In particular, based on a previous on cycle (e.g., on cycle (N−1)), the capacitors 636 and 638 hold or define a differential voltage. In the configuration shown in FIG. 7, the first leads of capacitors 636 and 638 are grounded (through switches 610), and the second leads of capacitors 636 and 638 are coupled to the connections 516 and 518, respectively, of the comparator 500. Thus, the capacitors 636 and 638 provide the compensation signal to the compensation input 512.

Also during the on cycle (N), because the input 616 and input 618 are shorted, the error controller 504 can check and compensate the amplifier 614 in a subsequent on cycle for DC offset. In particular, during the on cycle (N) as shown, with the inputs 616 and 618 shorted, any DC offset at the outputs 630 and 632 of the amplifier 614 drives a differential voltage to the capacitors 626 and 628 through the switches 640, the differential voltage to be used in a subsequent off cycle (discussed more below).

The trigger event for sampling the differential voltage by the sample and hold circuit 502 may take place when the current through the inductance (e.g., inductor 110) meets the average current $I_{AVG}$, or when the current through the inductance meets the peak current $I_{MAX}$ (or both). For purposes of this discussion, assume the trigger event is the current reaching the peak current $I_{MAX}$. Once the peak current is reached, the example system transitions to the immediately subsequent off cycle (referred to as off cycle (N)).

Figure 8:
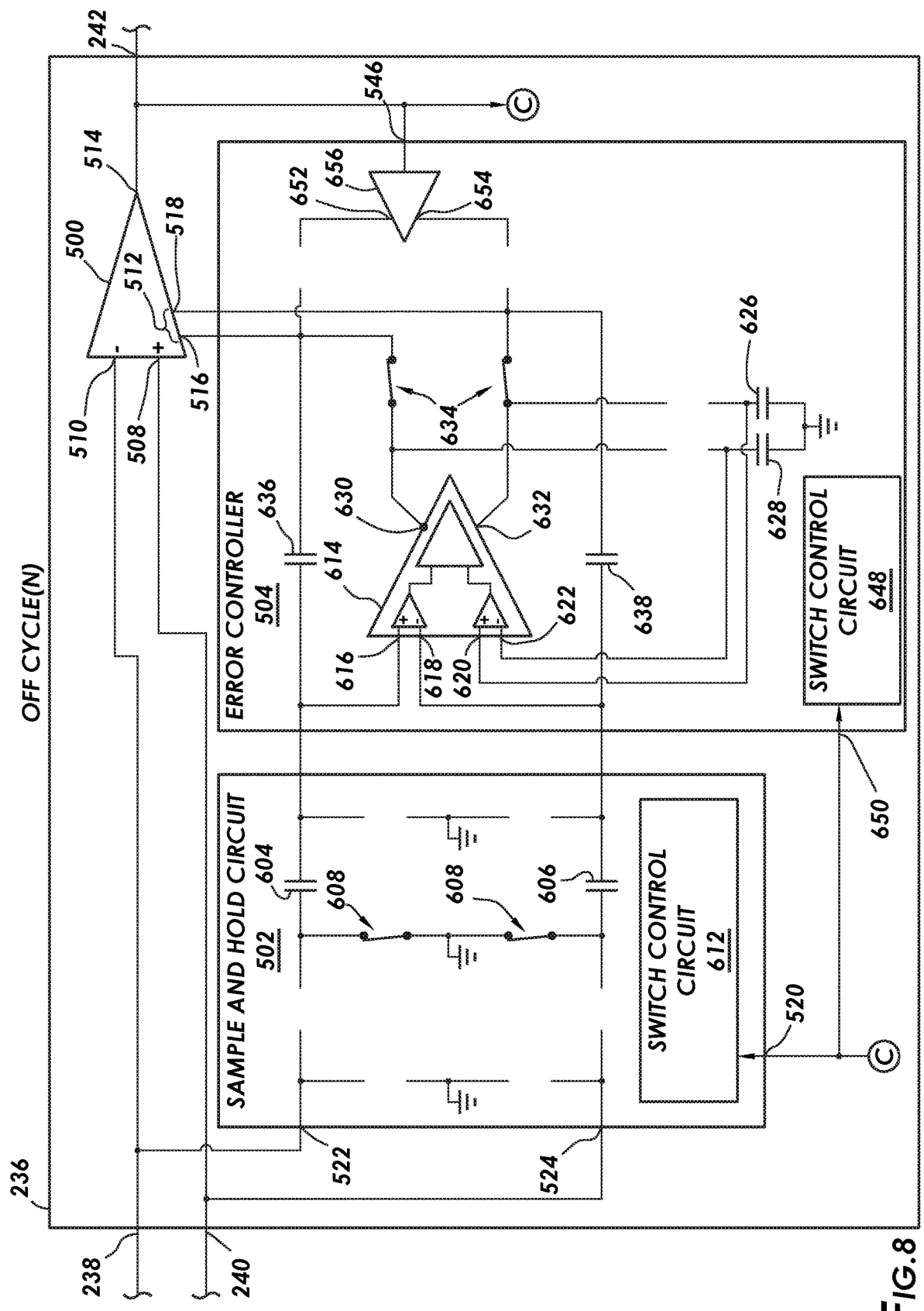
FIG. 8 shows the comparator system during an off cycle of the power converter, in accordance with at least some embodiments.

FIG. 8 shows the comparator system during an off cycle of the power converter, in accordance with at least some embodiments. In particular, FIG. 8 shows the comparator system in an off cycle immediately subsequent to the on cycle (N) (thus the off cycle referred to an off cycle (N)). In particular, during the off cycle (N) the switches 608 in the sample and hold circuit 502 are conductive. Moreover, switches 634 in the error controller 504 are conductive. In the state shown in FIG. 8, the second lead of capacitor 604 is coupled to the input 616 of the amplifier 614, and the first lead is grounded. The second lead of capacitor 606 is coupled to the input 618 of the amplifier 614, and the first lead is grounded. It follows that the differential voltage induced across the capacitors 604 and 606 during the sampling during on cycle (N) is applied to the comparator inputs 616 and 618 during the off cycle (N) as shown.

Still during off cycle (N), during periods of time when the differential voltage on capacitors 604 and 606 is coupled to the inputs 616 and 618, the amplifier 614 produces a current through connections 630 and 632 proportional to the differential voltage. Moreover, and as shown, the current through connections 630 and 632 is compensated proportional to the voltage applied to the first and second connections 620 and 622 by way of the capacitors 626 and 628 (with the voltage on capacitors 626 and 628 created in the on cycle (N)). It follows that during the off cycle (N) the error controller 504 is effectively integrating (e.g., summing over time) the differential voltage in the form of differential voltage across capacitors 604 and 606 with the result stored on capacitors 636 and 638. As we shall see, in a subsequent on cycle, e.g. on cycle (N+1), the differential voltage across the second leads of capacitors 636 and 638 is the compensation signal applied to the compensation input 512, with the goal of reducing or minimizing the differential voltage at the comparator 500 inputs when the comparator 500 toggles.

Figure 9:
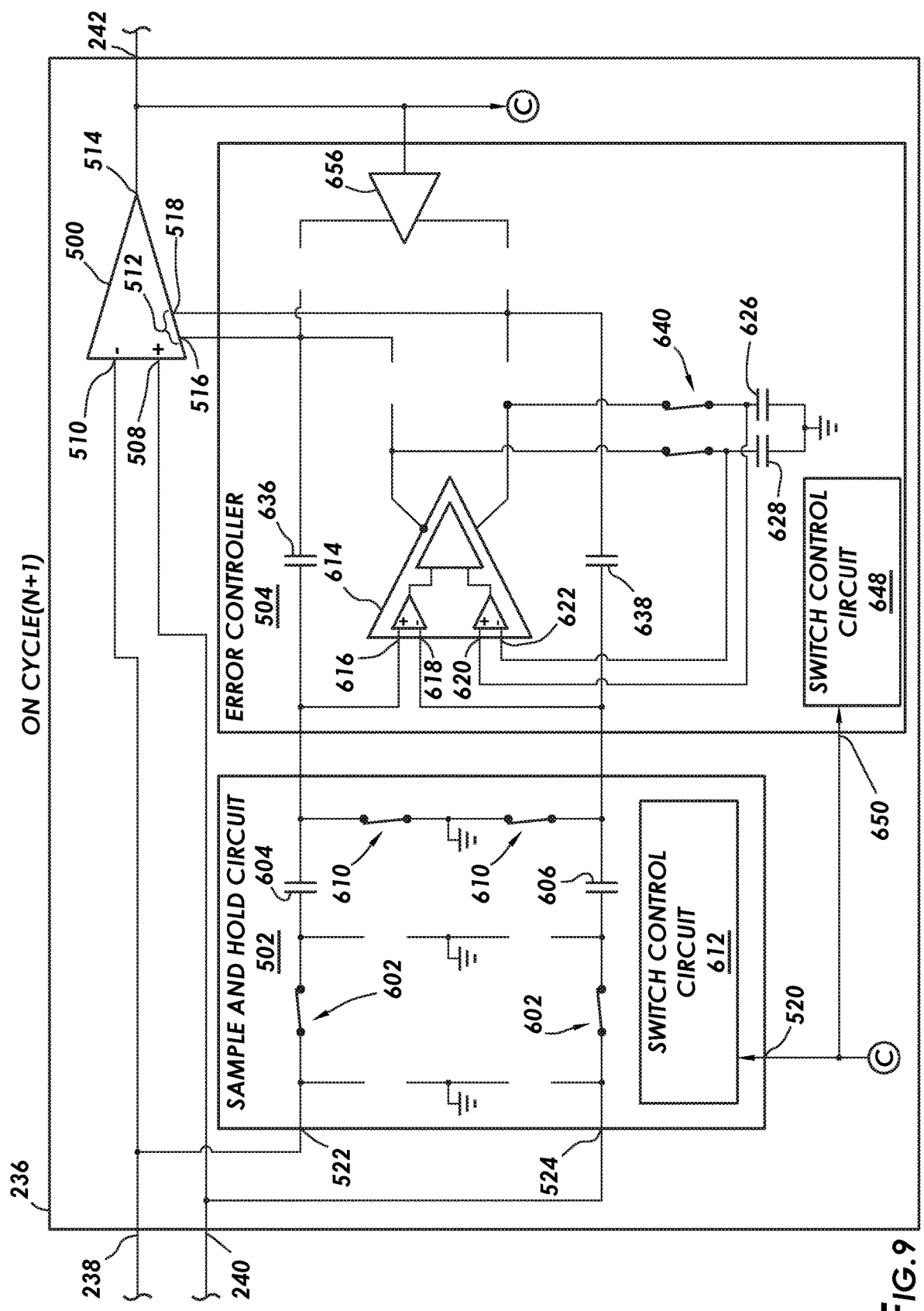
FIG. 9 shows the comparator system during a subsequent on cycle, in accordance with at least some embodiments.

FIG. 9 shows the comparator system during a subsequent on cycle, in accordance with at least some embodiments. In particular, FIG. 9 shows the comparator system during an immediately subsequent on cycle (referred to as on cycle (N+1)). During the on cycle (N+1) again the switches 602 and 610 in the sample and hold circuit 502 are conductive. Moreover, switches 640 in the error controller 504 are conductive. In the state shown in FIG. 9, again the capacitors 604 and 606 are set up to sample the differential voltage across the first and second sample inputs 522 and 524. As before, in on cycle (N+1) switches 610 ground the second leads of capacitors 604 and 606, and also short and ground inputs 616 and 618 of the amplifier 614 in the error controller 504. So again during the on cycle (N+1), any DC bias of the amplifier 614 results in a differential voltage across capacitors 626 and 628 through switches 640.

Still during on cycle (N+1), during periods of time when the capacitors 604 and 606 are coupled to the first sample input 522 and the second sample input 524 as shown, the error controller 504 is providing a compensation signal to the compensation input 512 of the comparator 500 (the compensation input in the example form of connections 516 and 518). In particular, based on differential voltage sampled at the end of on cycle (N), the integration that during off cycle (N), the voltage across the second leads of capacitors 636 and 638 is the compensation signal applied to the compensation input 512. And the cycles continue.

Returning briefly to FIG. 1. The various operational techniques described to this point have assumed that the lighting microcontroller 102 has commanded the power converter 104 to provide the average current to the example load being LEDs 108, and thus the regulating controller 234 (FIG. 2) is providing the pulse signal to the power switch 210. However, there may be periods of time when the system 100 is off (e.g., the automobile's headlights are off, a turn signal is inactive, and during PWM dimming). In such situations, the voltages on the various capacitors within the power converter 104 may discharge. On the next power-up event, the discharged capacitors may cause undershoot or overshoot of the current to the load. In order to reduce undershoot and overshoot after an extended power off event, example embodiments may perform a static compensation after powering of the power converter but prior to the application of the pulse signal to the power switch 210 (FIG. 2).

Figure 10:
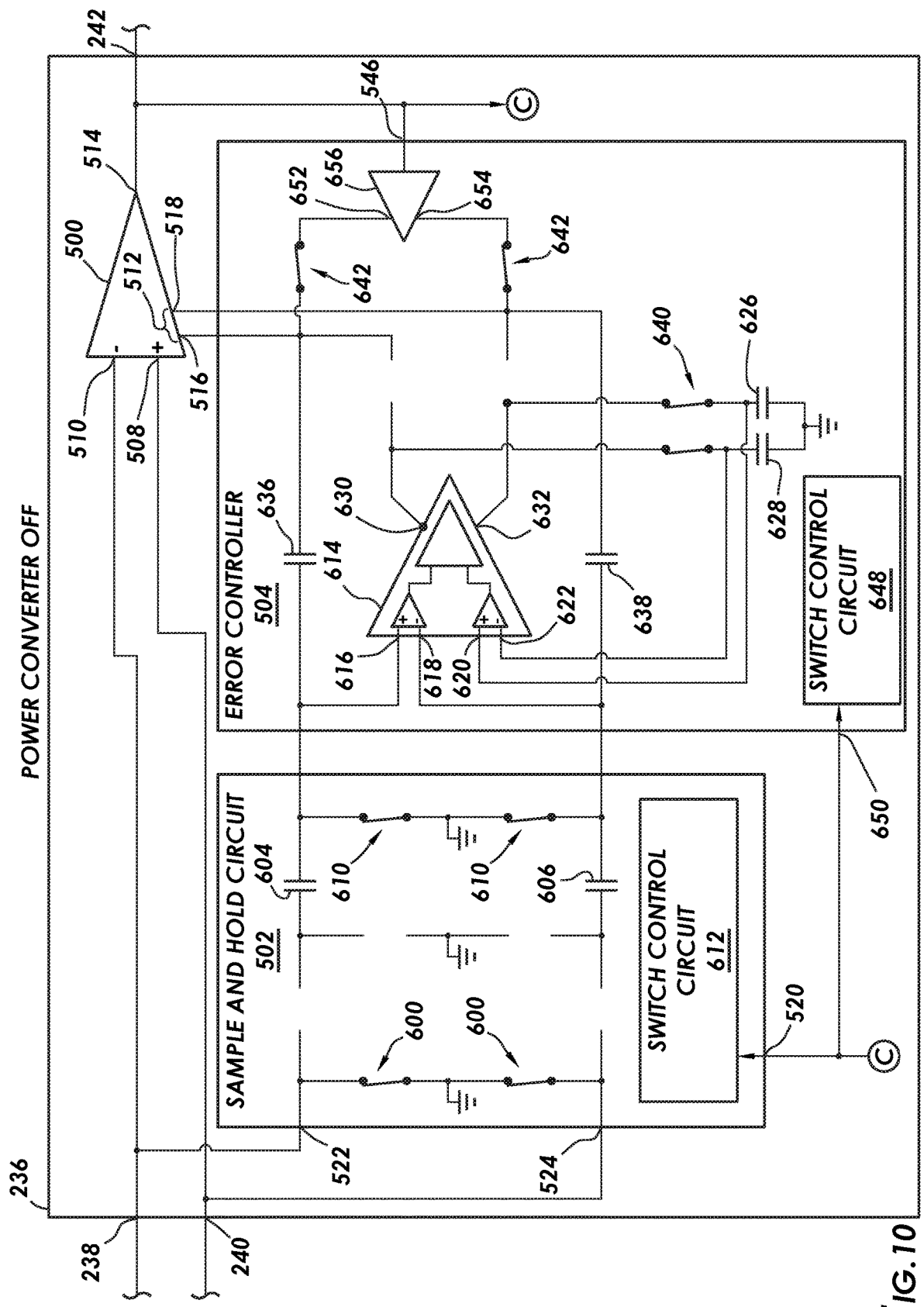
FIG. 10 shows the comparator system during a status compensation in accordance with at least some embodiments.

FIG. 10 shows the comparator system during a static compensation in accordance with at least some embodiments. In particular, during static compensation the comparator 500 may be compensated for DC offset, the amplifier 614 may be compensated for DC offset, or both simultaneously. The discussion continues assuming both the comparator 500 and amplifier 614 are compensated. Thus, during static compensation the switches 600 and 610 in the sample and hold circuit 502 are conductive. Also during static compensation switches 640 and 642 in the error controller 504 are conductive. The inverting input 510 and non-inverting input 508 of comparator 500 are shorted and grounded by way of switches 600. Any DC bias of the output 514 of the comparator 500 may thus be measured, and the comparator 500 compensated in the first on cycle. During periods when the comparator 500 inputs are shorted as shown, any voltage on the output 514 produces a current driven through outputs 652 and 654 of amplifier 656. Because the outputs are connected to the second leads of the capacitors 636 and 638 as shown, the DC bias of the output 514 results in changes to the differential voltage across the second leads of the capacitors 636 and 638. In a subsequent on cycle (e.g., a first on cycle after extended outage), the differential voltage across the second leads of capacitors 636 and 638 is the compensation signal applied to the compensation input 512.

In example static compensation the amplifier 614 is also compensated. That is, in the static compensation case of FIG. 10 the input 616 and input 618 of the amplifier 614 are shorted. The error controller 504 compensates the amplifier 614 in a subsequent off cycle for DC offset. In particular, during the static compensation case as shown, with the inputs 616 and 618 shorted, any DC offset at the outputs 630 and 632 of the amplifier 614 drives a differential voltage to the capacitors 626 and 628 through the switches 640 to be used in a subsequent off cycle.

Figure 11:
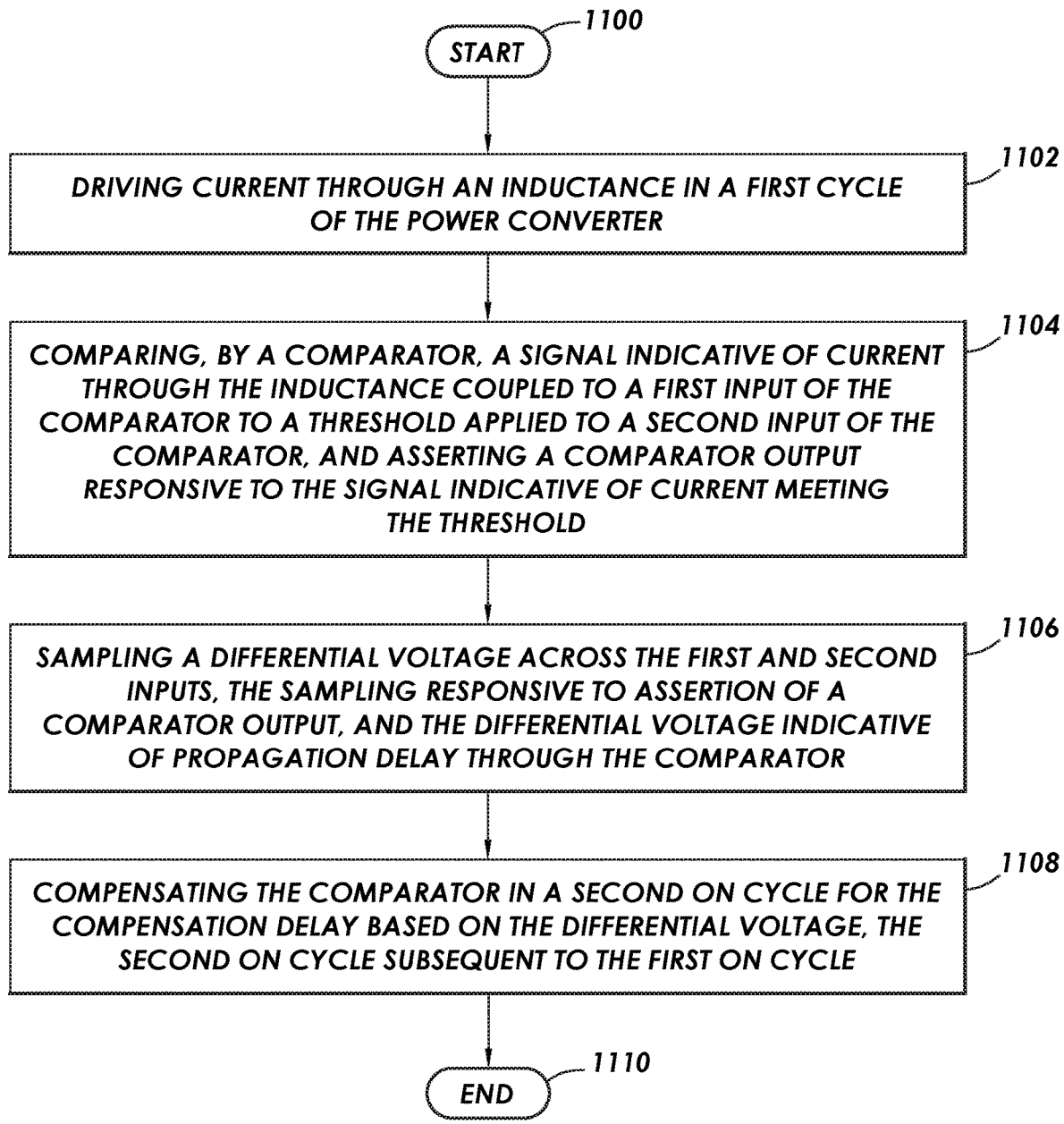
FIG. 11 shows a method in accordance with at least some embodiments.

FIG. 11 shows a method in accordance with at least some embodiments. In particular, the method starts (block 1100) and comprises: driving current through an inductance in a first on cycle of the power converter (block 1102); comparing, by a comparator, a signal indicative of current through the inductance coupled to a first input of the comparator to a threshold applied to a second input of the comparator, and asserting a comparator output responsive to the signal indicative of current meeting the threshold (block 1104); sampling a differential voltage across the first and second inputs, the sampling responsive to assertion of a comparator output, and the differential voltage indicative of propagation delay through the comparator (block 1106); and compensating the comparator in a second on cycle for the compensation delay based on the differential voltage, the second on cycle subsequent to the first on cycle (block 1108). Thereafter the method ends (block 1110), likely to restart.

The above discussion is meant to be illustrative of the principles and various embodiments of the present invention. Numerous variations and modifications will become apparent to those skilled in the art once the above disclosure is fully appreciated. For example, while the example embodiments sense voltages associates with current through the main and sense transistors, in other cases the voltages may be sensed by way of sense resistors. It is intended that the following claims be interpreted to embrace all such variations and modifications.

What is claimed is:

1. A method of operating a power converter comprising:
   driving current through an inductance in a first on cycle of the power converter;
   comparing, by a comparator, a signal indicative of current through the inductance coupled to a first input of the comparator to a threshold applied to a second input of the comparator, and asserting a comparator output responsive to the signal indicative of current meeting the threshold;
   sampling a differential voltage across the first and second inputs of the comparator, the sampling responsive to assertion of the comparator output, and the differential voltage indicative of propagation delay and/or offset through the comparator; and
   compensating the comparator in a second on cycle for the propagation delay and/or offset based on the differential voltage sampled in the first on cycle, the second on cycle subsequent to the first on cycle.

2. The method of claim 1 further comprising, prior to the first on cycle and during a period of time when the power converter is not supplying power to a load:
   shorting the first and second inputs of the comparator;
   measuring direct current (DC) offset of the comparator output during the shorting; and
   compensating the comparator for the DC offset.

3. The method of claim 1 wherein comparing the signal indicative of current to the threshold further comprises comparing the signal indicative of current to the threshold being a peak current threshold at which the first on cycle ends.

4. The method of claim 1 wherein comparing the signal indicative of current to the threshold further comprises comparing the signal indicative of current to the threshold being an average current threshold.

5. The method of claim 1 further comprising:
   shorting, during the first on cycle, a first and second inputs of an amplifier of an error controller;
   measuring direct current (DC) offset of the amplifier of the error controller during the shorting; and
   compensating the amplifier of the error controller for the DC offset.

6. The method of claim 1 wherein compensation the comparator further comprises:
   driving, during a first off cycle, a compensation voltage to a capacitor; and
   coupling the compensation voltage to compensation inputs of the comparator, the compensation voltage coupled to the compensation inputs of the comparator during the second on cycle.

7. A packaged semiconductor device that implements a driver for a direct current (DC) to DC power converter, the packaged semiconductor device comprising:
   a comparator system defining a first input, a second input, and a comparator output, the first input coupled to a voltage indicative of current supplied by the DC to DC converter to a load, and the second input coupled to a reference voltage;
   a regulating controller configured to generate a pulse signal that controls supply of current to the load, and with asserted times of the pulse signal based on a value indication of current supplied to the load;
   the comparator system further comprises:
      a comparator defining the first input, the second input, the comparator output, and a compensation input, the comparator configured to compensate the first and second inputs based on the compensation input;
      a sample and hold circuit defining a trigger input, a sample output, a first sample input coupled to the first input, and a second sample input coupled to the second input, the sample and hold circuit configured to sample a differential voltage across the first and second inputs responsive to assertion of the trigger input, and to apply the differential voltage to the sample output responsive to de-assertion of the trigger input;
      an error controller defining an error input and a control output, the error input coupled to the sample output, and the control output coupled to the compensation input of the comparator; and
      the error controller configured to supply a compensation signal on the control output based on the differential voltage over one or more cycles of the pulse signal, the compensation signal to compensate the comparator for propagation delay through the comparator.

8. The packaged semiconductor device of claim 7:
   wherein the sample and hold circuit is configured to sample the differential voltage on the first and second inputs during a first on cycle of the pulse signal; and
   wherein the error controller is further configured to supply the compensation signal during a second on cycle of the pulse signal based on the differential voltage during the first on cycle of the pulse signal.

9. The packaged semiconductor device of claim 7:
wherein the sample and hold circuit is configured to sample the differential voltage on the first and second inputs at a termination of a first on cycle of the pulse signal; and
wherein the error controller is further configured to supply the compensation signal during a second on cycle of the pulse signal based on the differential voltage during sampled at the termination of the first on cycle of the pulse signal.

10. The packaged semiconductor device of claim 7 wherein the error controller is further configured to create the compensation signal using at least one control methodology from a group comprising: Proportional Integral Differential (PID) control; Proportional Integral (PI) control; integral-only control.

11. The packaged semiconductor device of claim 7:
wherein the compensation input of the comparator is a differential input comprising a first and second connections; and
wherein the control output is a differential output comprising a first and second connections.

12. The packaged semiconductor device of claim 11:
wherein the sample output of the sample and hold circuit is a differential output comprising a first and second connections; and
wherein the error input of the error controller is a differential output comprising a first and second connections.

13. The packaged semiconductor device of claim 7 wherein trigger input of the sample and hold circuit is coupled to the comparator output of the comparator.

14. The packaged semiconductor device of claim 7 wherein the error controller further comprises:
an amplifier coupled to the sample output of the sample and hold circuit;
a first capacitor; and
a first switch coupled between the amplifier and the first capacitor;
the error controller configured to make the first switch non-conductive during a first on cycle of the pulse signal, and the error controller configured to make the first switch conductive during a first off cycle of the pulse signal and configured to drive the compensation signal to the first capacitor during the first off cycle.

15. A system for supplying power to a load, comprising:
a power converter;
an inductive load coupled to the power converter;
the power converter comprises:
a comparator system defining a first input, a second input, and a comparator output, and the first input coupled to a voltage indicative of current supplied by the power converter to the inductive load;
a regulating controller configured to generate a pulse signal that controls supply of current to the load, and with asserted times of the pulse signal based on a value indication of current supplied to the inductive load;
wherein the comparator system is configured to:
compare, during a first on cycle of the pulse signal, a signal indicative of current to the inductive load applied to the first input to a threshold applied to the second input, and assert the comparator output when the signal indicative of current meets or exceeds the threshold;
sample a differential voltage across the first and second inputs, the sampling responsive to assertion of a comparator output, and the differential voltage indicative of propagation delay and/or offset through the comparator system; and
compensate the comparator system in a second on cycle, subsequent to the first on cycle, for the propagation delay and/or offset based on the differential voltage.

16. The system of claim 15 wherein when the comparator system compares the signal indicative of current to the threshold, the comparator system is further configured to compare the signal indicative of current to the threshold being a peak current threshold.

17. The system of claim 15 wherein when the comparator system compares the signal indicative of current to the threshold, the comparator system is further configured to compare the signal indicative of current to the threshold being an average current threshold.

18. The system of claim 15 wherein the comparator system is further configured to:
short the first and second inputs of the comparator system;
measure direct current (DC) offset of the comparator output during the shorting; and
compensate the comparator system for the DC offset.

19. The system of claim 15 wherein the comparator system further comprises:
a comparator defining the first input, the second input, the comparator output, and a compensation input, the comparator configured to compensate the first and second inputs based on the compensation input;
a sample and hold circuit defining a trigger input, a first sample input, a second sample input, and a sample output, the sample and hold circuit configured to sample a differential voltage across the first and second inputs responsive to assertion of the trigger input, and to apply the differential voltage to the sample output;
an error controller defining an error input and a control output, the error input coupled to the sample output, and the control output coupled to the compensation input of the comparator;
the error controller configured to supply a compensation signal on the control output based on the differential voltage over one or more cycles of the pulse signal, the compensation signal to compensate the comparator for propagation delay through the comparator.

20. The system of claim 19 wherein the error controller further comprises:
an amplifier coupled to the sample output of the sample and hold circuit;
a first capacitor; and
a first switch coupled between the amplifier and the capacitor;
the error controller configured to make the first switch non-conductive during the first on cycle of the pulse signal, and the error controller configured to make the first switch conductive during the first off cycle of the pulse signal and configured to drive the compensation signal to the first capacitor by the amplifier during the first off cycle.

* * * * *